(12) United States Patent
Kim

(10) Patent No.: US 7,557,501 B2
(45) Date of Patent: Jul. 7, 2009

(54) FLAT PANEL DISPLAY DEVICE HAVING MOLYBDENUM CONDUCTIVE LAYER

(75) Inventor: Tae-Sung Kim, Seoul (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 490 days.

(21) Appl. No.: 11/078,381

(22) Filed: Mar. 14, 2005

(65) Prior Publication Data
US 2005/0206304 A1    Sep. 22, 2005

(30) Foreign Application Priority Data
Mar. 19, 2004    (KR) ...................... 10-2004-0019005

(51) Int. Cl.
*H01J 1/62*    (2006.01)
*H01J 63/04*    (2006.01)
(52) U.S. Cl. ...................... 313/506; 313/504
(58) Field of Classification Search ................. 313/504, 313/506
See application file for complete search history.

(56) References Cited

U.S. PATENT DOCUMENTS

| | | | |
|---|---|---|---|
| 6,686,606 B2 * | 2/2004 | Jeong et al. ................ | 257/59 |
| 6,762,802 B2 * | 7/2004 | Ono et al. .................. | 349/38 |
| 7,005,671 B2 * | 2/2006 | Yamazaki et al. ......... | 257/40 |
| 7,211,838 B2 * | 5/2007 | Miyazawa ................. | 257/187 |
| 7,442,961 B2 * | 10/2008 | Sagawa et al. ............ | 257/72 |
| 2001/0040648 A1 * | 11/2001 | Ono et al. .................. | 349/43 |
| 2003/0062519 A1 * | 4/2003 | Yamazaki et al. ......... | 257/40 |
| 2003/0160247 A1 * | 8/2003 | Miyazawa ................. | 257/79 |
| 2003/0160252 A1 * | 8/2003 | Jeong et al. ............... | 257/81 |
| 2006/0202207 A1 * | 9/2006 | Sagawa et al. ............ | 257/72 |

FOREIGN PATENT DOCUMENTS

| | | |
|---|---|---|
| JP | 2000-196100 | 7/2000 |
| JP | 2001-255831 | 9/2001 |
| KR | 0130738 B1 | 4/1998 |
| KR | 1020020013787 A1 | 2/2002 |
| KR | 1020030086668 A1 | 11/2003 |

* cited by examiner

*Primary Examiner*—Peter Macchiarolo
(74) *Attorney, Agent, or Firm*—H. C. Park & Associates, PLC

(57) ABSTRACT

A flat panel display device may include an insulating substrate with a conductive layer pattern formed of Mo layer or Mo alloy layer having a tensile stress thereon. A silicon nitride or silicon oxynitride layer may be located on the conductive layer pattern. With such an arrangement, one can achieve stress balance between the conductive layer pattern and the insulating layer, and improve the adhesion characteristics between the conductive layer pattern and the insulating layer.

22 Claims, 4 Drawing Sheets

FLAT PANEL DISPLAY DEVICE HAVING MOLYBDENUM CONDUCTIVE LAYER

CROSS-REFERENCE TO RELATED APPLICATION

This application claims the benefit of Korean Patent Application No. 2004-19005, filed Mar. 19, 2004, the disclosure of which is incorporated herein by reference in its entirety.

BACKGROUND OF THE INVENTION

1. Field of the Invention

The present invention relates to a flat panel display device and method of fabricating the same and, more particularly, to an active matrix flat panel display device and method of fabricating the same.

2. Description of the Related Art

An active matrix flat panel display device comprises a unit pixel defined by a gate line and a data line, and arranged in a matrix form. The unit pixel comprises at least one thin film transistor (TFT), a pixel electrode controlled by the TFT, and an opposite electrode facing the pixel electrode. The active matrix flat panel display device includes several thin films, such as the gate line, the data line, the pixel electrode, and an insulating layer disposed between them. For process stability in fabricating this flat panel display device, it is very important to optimize a stress combination between the thin films.

Particularly, when there occurs stress imbalance between the wirings, such as the gate line and the data line, and the insulating layer that come in contact with the lines respectively, adhesion degradation between the wiring and the insulating layer and substrate bending can occur.

SUMMARY OF THE INVENTION

The present invention provides, inter alia, a flat panel display device and an organic light-emitting device that achieves stress balance between a wiring and an insulating layer thereby improving adhesion characteristics between the wiring and the insulating layer.

The flat panel display device may include an insulating substrate. A conductive layer pattern formed of a Mo layer or a Mo alloy layer having a tensile stress may be located on the insulating substrate. A silicon nitride or silicon oxynitride layer may be located on the conductive layer pattern. The conductive layer pattern may form, for example, a source electrode, a drain electrode, or wiring.

The organic light-emitting device may include an insulating substrate. A semiconductor layer may be located on the insulating substrate. A conductive layer pattern may be formed of a Mo layer or a Mo alloy layer having a suitable tensile stress, and it may form, for example, a source electrode or a drain electrode. The conductive layer pattern may contact both ends of the semiconductor layer. A passivation layer formed of a silicon nitride layer or a silicon oxynitride layer may be located on the conductive layer pattern. A pixel electrode contacting the source or drain electrode may be located on the passivation layer. The conductive layer forming the source or drain electrode may also form wiring.

For an organic light-emitting device, the pixel electrode may be formed of, for example, Indium Tin Oxide (ITO) or Indium Zinc Oxide (IZO).

For a flat panel display device (including, for example, an organic light-emitting device), the appropriate tensile stress of the conductive layer pattern may be about 300 MPa or less. The conductive layer pattern may be about 3000 to about 7000 Å thick.

The Mo alloy (for a flat panel display) may be a Mo—W alloy. The tensile stress of the conductive layer pattern formed of the Mo—W alloy may be about 300 MPa or less. The conductive layer pattern formed of the Mo—W alloy may be about 3000 to about 7000 Å thick. The Mo—W alloy may contain about 5 to about 25 wt. % of W.

For the flat panel display device and the organic light-emitting device, the silicon nitride layer and the silicon oxynitride layer may contain about 20 at. % or less hydrogen. Preferably, the silicon nitride layer and the silicon oxynitride layer may contain about 10 to about 20 at. % of hydrogen. The insulating substrate may be a heat-treated glass substrate.

DETAILED DESCRIPTION OF THE INVENTION

Figure 1:
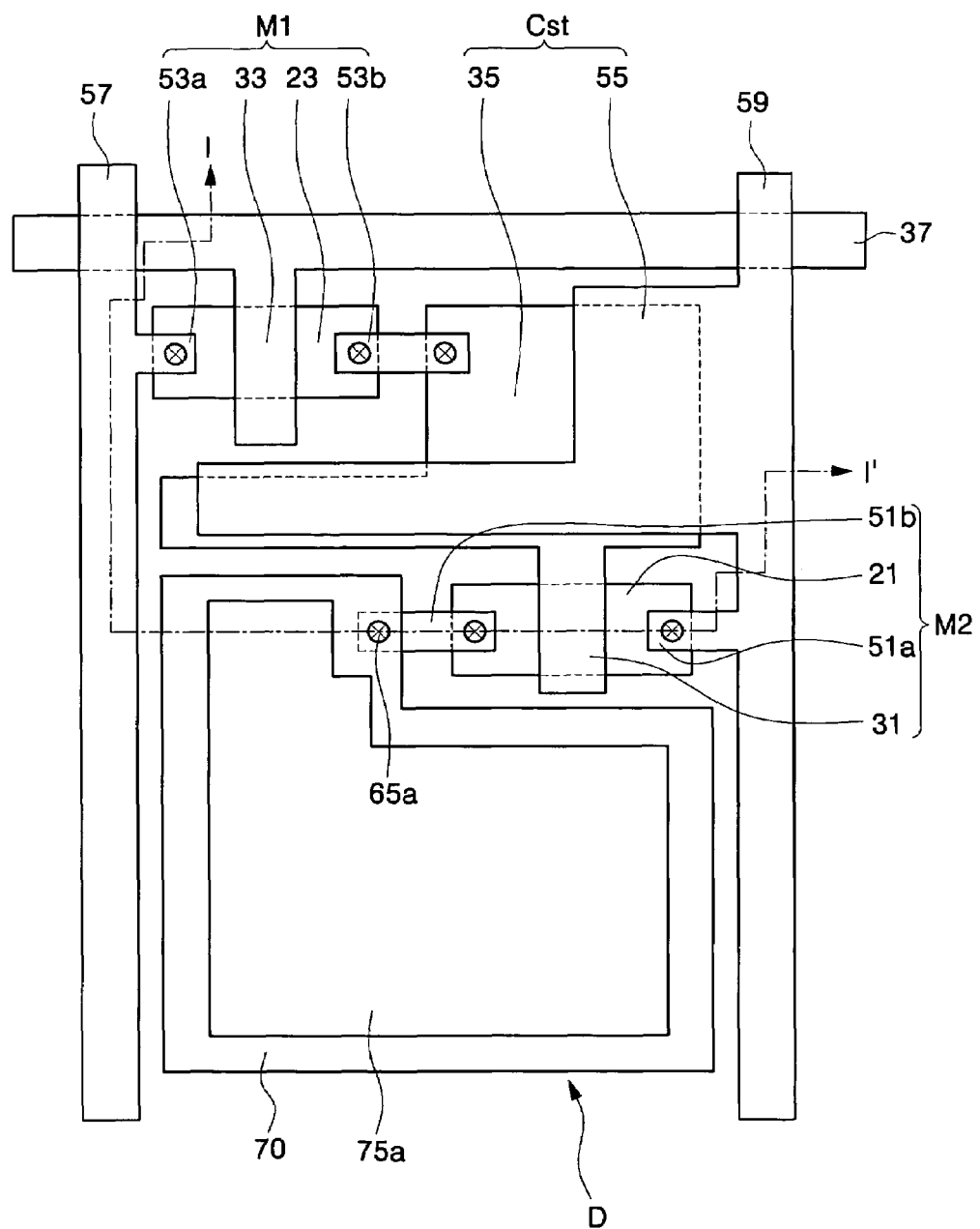
FIG. 1 is a plan view illustrating a unit pixel of an organic light-emitting device according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. In the drawings, when one layer is shown located on another layer or substrate, it is implied that the layer can be either directly formed on the other layer of the substrate or that one or more interlayers (or intersubstrates) may be interposed between them. Like numbers refer to like elements throughout the specification.

Figure 2:
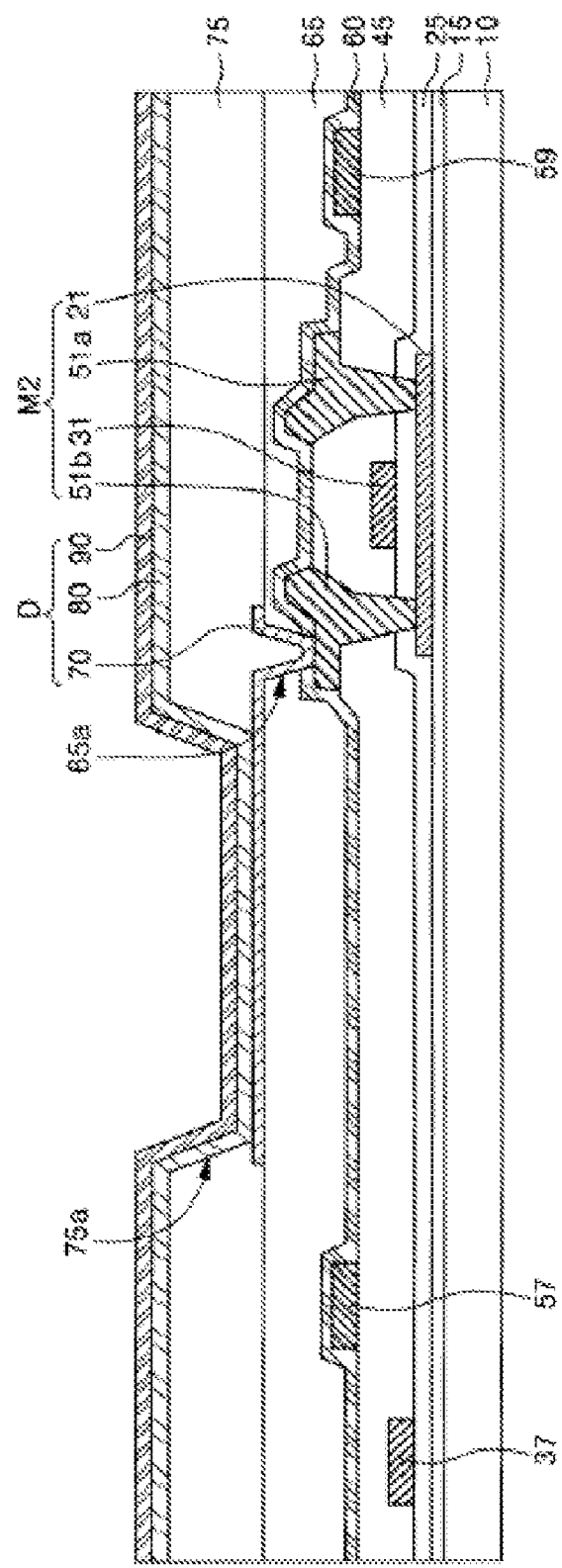
FIG. 2 is a cross-sectional view for illustrating an organic light-emitting device and method of fabricating the same according to an embodiment of the present invention taken along the line I-I' of FIG. 1.

FIG. 1 is a plan view illustrating a unit pixel of an organic light-emitting device according to an embodiment of the present invention, and FIG. 2 is a cross-sectional view for illustrating an organic light-emitting device and method of fabricating the same according to an embodiment of the present invention taken along the line I-I' of FIG. 1.

As shown in FIGS. 1 and 2, a substrate 10 can be any suitable substrate, such as, for example, a glass or plastic substrate. The glass or plastic substrate can easily bend due to stress of the thin films formed on the substrate. Therefore, the substrate 10 may be provided with a heat-treated glass substrate so that bending may be relatively small. A buffer layer 15 may be formed on the substrate 10. The buffer layer 15 may be a layer for protecting a TFT formed in the subsequent process from impurities such as alkali ions emitted from the substrate 10. The buffer layer 15 can be formed of, for example, a silicon oxide layer, a silicon nitride layer, a silicon oxynitride layer or a combination of those layers.

An amorphous silicon layer may be deposited on the buffer layer 15, and may be crystallized to form a polysilicon layer. The crystallization of the amorphous silicon layer may be accomplished using Excimer Laser Annealing (ELA), Sequential Lateral Solidification (SLS), Metal Induced Crystallization (MIC), Metal Induced Lateral Crystallization (MILC), or the like.

The polysilicon layer may be patterned to form a driving TFT semiconductor layer 21 and a switching TFT semiconductor layer 23 on the substrate 10. A gate insulating layer 25 may be formed on the entire surface of the substrate having the semiconductor layers 21 and 23. A first conductive layer may be deposited on the gate insulating layer 25, and may be patterned to form the first conductive layer pattern. The first conductive layer pattern may include a gate line 37, a switching TFT gate electrode 33 protruding from the gate line 37 and crossing the switching TFT semiconductor layer 23, a storage capacitor lower electrode 35, and a driving TFT gate electrode 31 crossing the driving TFT semiconductor layer 21. The first conductive layer pattern may be formed of, for example, Al, Al alloy, Mo, or Mo alloy. Preferably, the first conductive layer pattern may be formed of chemically and physically stabilized Mo or Mo alloy.

An interlayer layer 45 may be formed on the entire surface of the substrate 10 where the first conductive layer pattern is formed. The interlayer layer 45 may be formed of a silicon oxide layer. Contact holes exposing a predetermined area of both ends of the semiconductor layers 21 and 23 and the storage capacitor lower electrode 35 may be formed in the interlayer layer, and then a second conductive layer may be deposited on the entire surface of the substrate having the contact holes. A second conductive layer pattern may be formed by patterning the second conductive layer. The second conductive layer may be formed of a Mo layer or a Mo alloy layer having the appropriate tensile stress. The Mo or Mo alloy has physically and chemically stable characteristics of, for example, excellent corrosion resistance, and high melting point compared with Al or Al alloy.

The second conductive layer pattern may include a data line 57 crossing the gate line 37, a power supply line 59 in parallel with the data line 57, a switching TFT source electrode 53a protruding from the data line 57 and contacting the switching TFT semiconductor layer 23, a switching TFT drain electrode 53b contacting the switching TFT semiconductor layer 23 as well as the storage capacitor lower electrode 35, a storage capacitor upper electrode 55 protruding from the power supply line 59, a driving TFT source electrode 51a protruding from the power supply line 59, and a driving TFT drain electrode 5ib contacting one side end of the driving TFT semiconductor layer 21 and a pixel electrode 70, which is described in more detail below.

A switching TFT M1 may include the switching TFT source electrode 53a, the switching TFT drain electrode 53b, the switching TFT gate electrode 33, and the switching TFT semiconductor layer 23. A driving TFT M2 may include the driving TFT source electrode 51a, the driving TFT drain electrode 51b, the switching TFT gate electrode 31, and the switching TFT semiconductor layer 21. A storage capacitor Cst may be formed with the storage capacitor lower electrode 35 and the storage capacitor upper electrode 55. Further, the gate line 37, the data line 57, and the power supply line 59 may be wirings that apply signals to the TFTs and the storage capacitor Cst.

A passivation layer 60 may be formed on the second conductive layer pattern, and the substrate 10 on which the passivation layer is formed may be heat-treated as described above. The passivation layer 60 may be formed of a silicon nitride or silicon oxynitride layer that contains a significant amount of hydrogen. The hydrogen contained in the passivation layer 60 may be diffused into the semiconductor layers 21 and 23 formed of the polysilicon, thereby avoiding the passivation defects such as a dangling bond located at a grain boundary of the polysilicon. Further, the passivation layer 60 formed of a silicon nitride or silicon oxynitride layer can prevent moisture or impurities from penetrating into the TFT. However, a passivation layer 60 formed of a silicon nitride or silicon oxynitride layer may have a relatively large compressive stress of about 200 to about 400 MPa.

The second conductive layer pattern contacting the passivation layer 60 may be formed of a Mo layer or Mo alloy layer that has tensile stress. Thus stress balance can be achieved and adhesion characteristics can be improved between the second conductive layer pattern and the passivation layer 60.

Preferably, the tensile stress of the second conductive layer pattern may be about 300 MPa or less. When the tensile stress of the second conductive pattern is above about 300 MPa, the substrate 10 may be subjected to stress due to the tensile stress of the second conductive layer pattern even though the passivation layer 60 has a compressive stress. Due to this stress, the center portion of the substrate 10 may be bent upward. The substrate bending can cause damage to the substrate 10 in the subsequent process, more specifically, in fixing the substrate 10 on the vacuum absorption plate in several apparatuses such as an exposure machine. Further, the substrate bending can cause a proceeding failure in an alignment apparatus, or other mechanism.

The second conductive layer pattern formed of a Mo layer or a Mo alloy layer may have a tensile stress of about 300 MPa or less and may be formed at about 70° C. or higher. Moreover, the second conductive layer pattern may be formed to a thickness of about 3000 to about 7000 Å. The second conductive layer pattern having the thickness of about 3000 to about 7000 Å can have appropriate sheet resistance Rs.

The Mo alloy that forms the second conductive layer pattern may be a Mo—W alloy. The Mo—W alloy may preferably contain about 5 to about 25 wt. % of W. When the content of W is less than about 5 wt. %, particles can be generated. When the content of W is above about 25 wt. %, it can be difficult to form the alloy.

The silicon nitride or silicon oxynitride layer forming the passivation layer 60 may contain hydrogen of about 20 at. % or less in order to help avoid excessive compression stress. Moreover, to help passivate defects such as imperfect dangling bonds in the grain boundary of the polysilicon as described above, it may be preferable that the silicon nitride or silicon oxynitride layer contains hydrogen of about 10 at. % or more. Consequently, it may be preferable that the silicon nitride or silicon oxynitride layer contains hydrogen of about 10 to about 20 at. %.

Further, a planarization layer 65 can be formed on the passivation layer 60. The planarization layer 65 (which can relieve problems with topology caused by the lower pattern) may be formed of benzocyclobutene (BCB). However, the planarization layer 65 can alternatively be altogether omitted. A via hole 65a may be formed to expose the driving TFT drain electrode 51b within the planarization layer 65 and the passivation layer 60.

A third conductive layer may be deposited on the entire surface of the substrate 10 having the via hole 65a. A pixel electrode 70 that contacts the driving TFT drain electrode 51b may be formed by patterning the third conductive layer. The pixel electrode 70 can be formed of Indium Tin Oxide (ITO) or Indium Zinc Oxide (IZO). As described above, the driving TFT drain electrode 51b is formed of the Mo or Mo alloy. Thus, the interface at which the pixel electrode 70 (formed of ITO or IZO) and the driving TFT drain electrode 51b contact may be improved over that of a driving TFT drain electrode 51b formed of Al or Al alloy.

A pixel-defining layer 75 having an opening 75a that exposes a predetermined area of the pixel electrode 70 can be formed on the pixel electrode 70. An organic functional layer 80 may be formed contacting the exposed pixel electrode 70 in the opening 75a. An opposition electrode 90 may be formed on the organic functional layer 80. The organic functional layer 80 may include, for example, an organic emission layer.

An organic light emitting diode D may include a pixel electrode 70, an organic functional layer 80, and an opposition electrode 90.

Although the present invention has been described with reference to the organic light-emitting display device, those skilled in the art will appreciate that the present invention can be modified in various respects, such as by being applied to a liquid crystal device.

Figure 3:
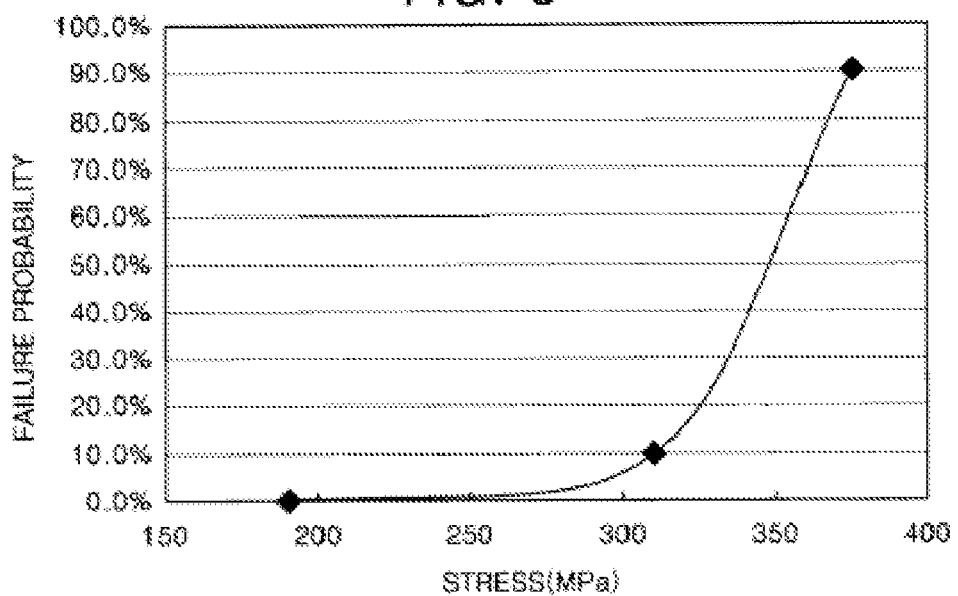
FIG. 3 is a graph showing a failure probability based on a stress change of a Mo—W alloy layer.

FIG. 3 is a graph showing a failure probability based on a stress change of a Mo—W alloy layer. The failure probability is a ratio of the substrate where the substrate damage and proceeding failure occur due to substrate bending in the alignment apparatus, etc.

As shown in FIG. 3, when the stress of the Mo—W alloy layer formed on the substrate goes above about 300 MPa, the failure probability may rapidly increase. However, when the stress is about 300 MPa or less, the failure probability may remain below about 10%, and can be reduced to about 0.001%. That is, when the stress of the Mo—W alloy layer is about 300 MPa or less, substrate bending rarely occurs.

Figure 4:
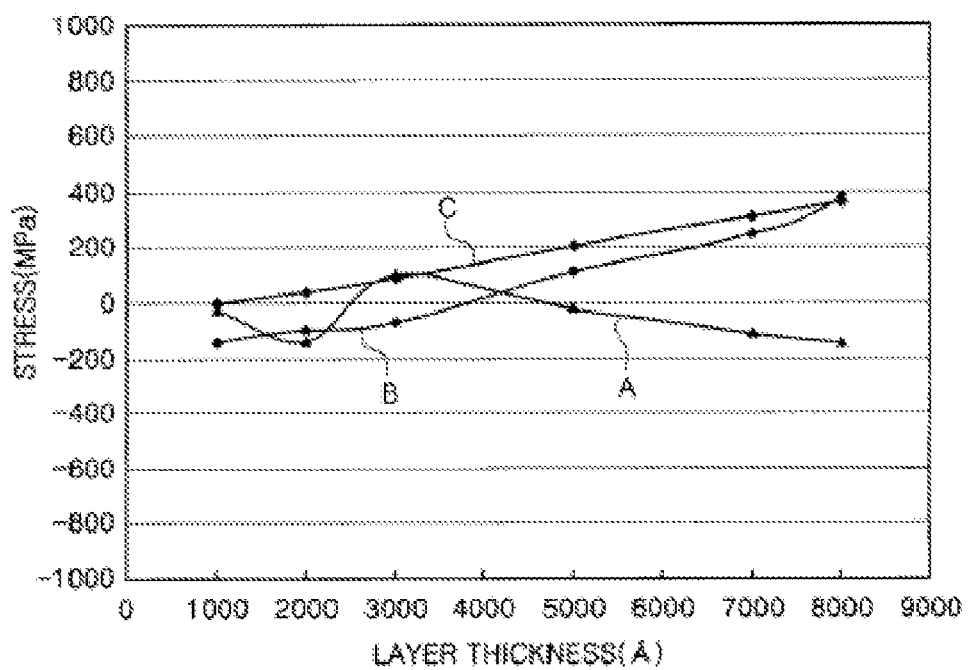
FIG. 4 is a graph showing a stress change based on a thickness of a Mo—W alloy layer.

FIG. 4 is a graph showing a stress change based on a thickness of a Mo—W alloy layer. The reference numerals A, B and C indicate Mo—W alloy layers formed at about 20° C., about 70° C. and about 150° C., respectively.

As shown in FIG. 4, when a Mo—W alloy layer is deposited at about 20° C. (A), it can be seen that the stress is independent of the thickness of the layer. However, when the Mo—W alloy layer is formed at about 70° C. or more (B, C), the stress characteristics change from compression stress (stress having a negative value) to tensile stress (stress having a positive value) as the layer grows thicker. When the Mo—W alloy layer is deposited at about 70° C. or more, the layer having the tensile stress may be about 3000 Å or more thick.

However, the tensile stress of the Mo—W alloy layer may preferably be about 300 MPa or less to prevent deformation (such as bending of the substrate). To obtain this, the thickness of the Mo—W alloy layer may be below 7000 Å.

Figure 5:
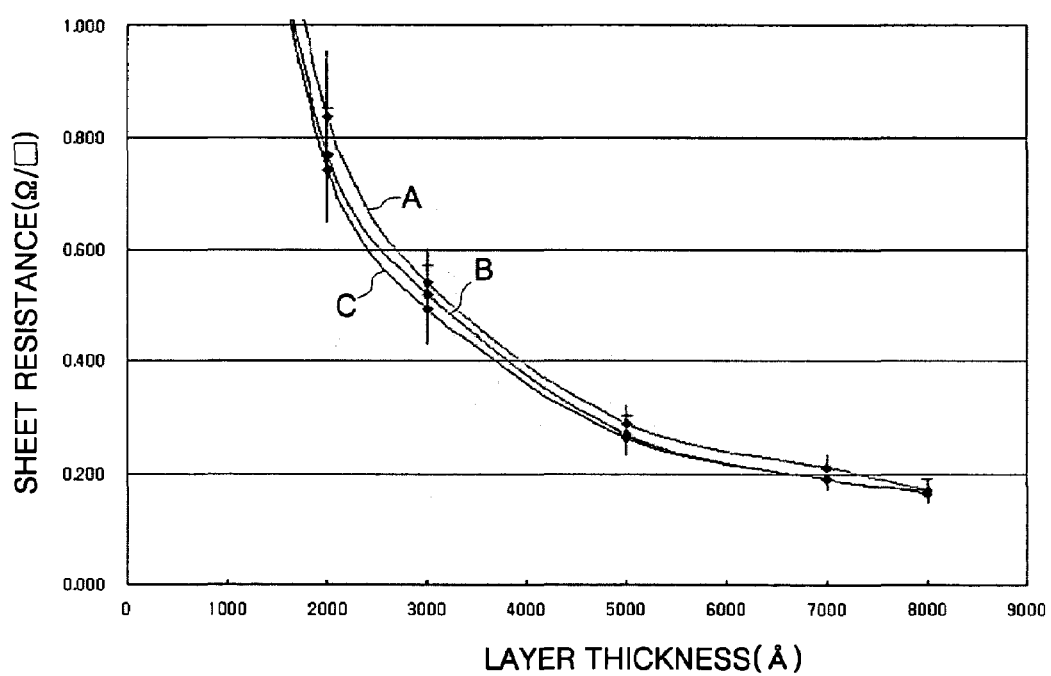
FIG. 5 is a graph showing sheet resistance characteristics based on a thickness of a Mo—W alloy layer.

FIG. 5 is a graph showing sheet resistance characteristics based on a thickness of a Mo—W alloy layer. The reference numeral A, B and C indicate Mo—W alloy layers formed at about 20, about 70, and about 150° C., respectively.

As shown in FIG. 5, the sheet resistance of the Mo—W alloy layer may not show a significant change according to the deposition temperature, but may change according to the thickness of the layer. When the Mo—W alloy layer is about 3000 to about 7000 Å thick, the Mo—W alloy may have an appropriate sheet resistance of about 0.2 to about 0.5 Ω/☐. Therefore, even if the wiring of the flat panel display device is formed of the Mo—W alloy having about 3000 to about 7000 Å thickness, a signal delay due to a voltage drop can be insignificant.

As described above, stress balance between the conductive layer pattern and the insulating layer can be achieved. Thus a flat panel display device such as an organic light-emitting display device and liquid crystal display with improved adhesion characteristics between the conductive layer pattern and the insulating layer can be obtained. Further, the conductive layer pattern may have a stress of about 300 MPa or less, thereby suppressing defects such as substrate damage due to the substrate bending.

What is claimed is:

1. A flat panel display device, comprising:
   a conductive layer pattern located on an insulating substrate and formed of at least one of a group of a Mo layer and a Mo alloy layer having a tensile stress; and
   a passivation layer comprising at least one of a group of a silicon nitride layer and a silicon oxynitride layer located on the conductive layer pattern,
   wherein the tensile stress of the conductive layer pattern is approximately balanced with a compressive stress in the passivation layer, and is about 300 MPa or less.

2. The flat panel display device of claim 1, wherein the conductive layer pattern comprises at least one of a group of a source electrode, a drain electrode, and wiring.

3. The flat panel display device of claim 1, wherein the conductive layer pattern is between about 3000 and about 7000 Å thick.

4. The flat panel display device of claim 1, wherein the Mo alloy comprises a Mo—W alloy.

5. The flat panel display device of claim 4 wherein the conductive layer pattern of the Mo—W alloy is about 3000 to about 7000 Å thick.

6. The flat panel display device of claim 4, wherein the Mo—W alloy contains about 5 to about 25 wt. % of W.

7. The flat panel display device of claim 1, wherein the silicon nitride layer and the silicon oxynitride layer each contain hydrogen of about 20 at. % or less.

8. The flat panel display device of claim 7, wherein the silicon nitride layer and the silicon oxynitride layer each contain hydrogen of about 10 to about 20 at. %.

9. The flat panel display device of claim 1, wherein the insulating substrate comprises a heat-treated glass substrate.

10. The flat panel display device of claim 1, wherein the compressive stress in the passivation layer is about 200 MPa to about 400 MPa.

11. An organic light-emitting device, comprising:
    a semiconductor layer located on an insulating substrate;
    a conductive layer pattern formed of at least one of a group of a Mo layer and a Mo alloy layer having a tensile stress, wherein the conductive layer pattern forms at least any one of a source electrode and a drain electrode and wherein the conductive layer pattern contacts both ends of the semiconductor layer;
    a passivation layer on the conductive layer pattern and comprising at least one of a group of a silicon nitride layer and a silicon oxynitride layer; and
    a pixel electrode located on the passivation layer and contacting at least one of a group of the source electrode and the drain electrode, wherein the tensile stress of the conductive layer pattern is approximately balanced with a compressive stress in the passivation layer, and is about 300 MPa or less.

12. The organic light-emitting device of claim 11, wherein the semiconductor layer comprises polycrystalline silicon.

13. The organic light-emitting device of claim 11, wherein the pixel electrode comprises at least one of the group of Indium Tin Oxide and Indium Zinc Oxide.

14. The organic light-emitting device of claim 11, wherein the conductive layer pattern is between about 3000 and about 7000 Å thick.

15. The organic light-emitting device of claim 11, wherein the Mo alloy comprises a Mo—W alloy.

16. The organic light-emitting device of claim 15, wherein the conductive layer pattern formed of the Mo—W alloy is about 3000 to about 7000 Å thick.

17. The organic light-emitting device of claim 15, wherein the Mo—W alloy contains about 5 to about 25 wt. % of W.

18. The organic light-emitting device of claim 11, wherein the conductive layer comprises at least one of a group of a source electrode and a drain electrode, and wherein the conductive layer also comprises wiring.

19. The organic light-emitting device of claim 11, wherein the silicon nitride layer and the silicon oxynitride layer each contain hydrogen of about 20 at. % or less.

20. The organic light-emitting device of claim 19, wherein the silicon nitride layer and the silicon oxynitride layer each contain hydrogen of about 10 to about 20 at. %.

21. The organic light-emitting device of claim 11, wherein the insulating substrate comprises a heat-treated glass substrate.

22. The organic light-emitting device of claim 11, wherein the compressive stress in the passivation layer is about 200 MPa to about 400 MPa.

* * * * *